United States Patent
Jang et al.

(10) Patent No.: US 11,824,654 B2
(45) Date of Patent: Nov. 21, 2023

(54) METHOD AND APPARATUS FOR DECODING POLAR CODE IN COMMUNICATION AND BROADCASTING SYSTEM

(71) Applicant: Samsung Electronics Co., Ltd., Suwon-si (KR)

(72) Inventors: Min Jang, Suwon-si (KR); Hyuntack Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/749,854

(22) Filed: May 20, 2022

(65) Prior Publication Data
US 2022/0278772 A1    Sep. 1, 2022

Related U.S. Application Data

(63) Continuation of application No. PCT/KR2020/017340, filed on Nov. 30, 2020.
(Continued)

(30) Foreign Application Priority Data

Nov. 30, 2020    (KR) .................. 10-2020-0165096

(51) Int. Cl.
*H04L 1/00* (2006.01)
*H03M 13/09* (2006.01)
*H03M 13/00* (2006.01)

(52) U.S. Cl.
CPC ........ *H04L 1/0061* (2013.01); *H03M 13/091* (2013.01); *H03M 13/611* (2013.01)

(58) Field of Classification Search
CPC .. H04L 1/0061; H04L 1/0054; H03M 13/091; H03M 13/611; H03M 13/3776;
(Continued)

(56) References Cited

U.S. PATENT DOCUMENTS

| 10,673,467 B2 | 6/2020 | El-Khamy et al. |
| 2011/0182385 A1 | 7/2011 | Doan et al. |

(Continued)

FOREIGN PATENT DOCUMENTS

| CN | 109194446 A | 1/2019 |
| KR | 10-2018-0031555 A | 3/2018 |

(Continued)

OTHER PUBLICATIONS

Thibaud Tonnellier et al., Length-compatible polar codes: a survey (invited paper), 53rd Annual Conference On Information Sciences and Systems (CISS), Apr. 16, 2019, XP033539158.
(Continued)

*Primary Examiner* — Thien Nguyen
(74) *Attorney, Agent, or Firm* — Jefferson IP Law, LLP

(57) ABSTRACT

The disclosure proposes a technique for achieving validity decision performance of a suitable level in communication and broadcasting systems using a polar code. The polar code is a channel code in which it is difficult to use a syndrome check due to a successive cancellation (SC)-based decoding operation and coding structure. Accordingly, in the communication of the related art and broadcasting systems using the polar code, a validity check of a decoding result has been performed by using a path-metric (PM) generated during decoding and a concatenated error detection code, such as a cyclic redundancy check (CRC) code. However, it is difficult to achieve target error detection performance only via such methods when the length of the CRC code is short or when input and output lengths of a code are short. In this regard, an embodiment of the disclosure proposes a method for obtaining a Euclidean distance-based metric between a received signal and a decoded signal by using an estimated codeword output bit sequence, and performing post error detection based on this.

14 Claims, 11 Drawing Sheets

Related U.S. Application Data

(60) Provisional application No. 62/941,992, filed on Nov. 29, 2019.

(58) Field of Classification Search
CPC ... H03M 13/2906; H03M 13/13; H03M 13/09
See application file for complete search history.

(56) References Cited

U.S. PATENT DOCUMENTS

| | | | |
|---|---|---|---|
| 2017/0366199 A1 | 12/2017 | Ge et al. | |
| 2018/0048418 A1 | 2/2018 | Ge et al. | |
| 2018/0083655 A1 | 3/2018 | El-Khamy et al. | |
| 2018/0262214 A1 | 9/2018 | Hui | |
| 2019/0109604 A1 | 4/2019 | El-Khamy et al. | |
| 2019/0165818 A1* | 5/2019 | Miyazaki | H04L 1/0057 |
| 2020/0412482 A1* | 12/2020 | Zhang | H04L 1/0052 |

FOREIGN PATENT DOCUMENTS

| | | |
|---|---|---|
| KR | 10-2019-0038620 A | 4/2019 |
| WO | 2018/204418 A1 | 11/2018 |
| WO | 2018/214101 A1 | 11/2018 |

OTHER PUBLICATIONS

Min Jang et al., Improving the tradeoff between error correction and detection of concatenated polar codes, IEEE Transactions on Communications, vol. 69, No. 7, Jul. 13, 2021, XP011865872.

European Search Report dated Dec. 1, 2022, issued in European Application No. 20894280.5.

Erdal Arıkan, Channel Polarization: a method for constructing capacity-achieving codes for symmetric binary-input memoryless channels, IEEE Transactions on Information Theory, vol. 55, No. 7, Jul. 2009.

Ido Tal et al., List decoding of polar codes, arXiv:1206.0050v1 [cs.IT] May 31, 2012.

3rd Generation Partnership Project; Technical Specification Group Radio Access Network; NR; Multiplexing and channel coding (Release 15), 3GPP TS 38.212 V15.1.0, Mar. 2018, Sophia Antipolis, France.

Alexios Balatsoukas-Stimming et al., LLR-based successive cancellation list decoding for polar codes, IEEE Transactions on Signal Processing, vol. 63, No. 19, Oct. 1, 2015.

Qualcomm Incorporated, Early termination for polar codes, R1-1709782, 3GPP TSG-RAN WG1 #89, May 15-19, 2017, Hangzhou, P. R. China.

Huawei et al., On nFAR for UL code construction, R1-1718506, 3GPP TSG RAN WG1 Meeting 90bis, Oct. 9-13, 2017, Prague, Czech Republic.

Alexios Balatsoukas-Stimming et al., LLR-Based Successive Cancellation List Decoding of Polar Codes, arXiv: 1401.3753v4 [cs.IT] Mar. 6, 2015, Submitted to IEEE Transactions on Signal Processing in Sep. 2014—Revised in Mar. 2015.

ZTE, Noma Receiver Complexity Analysis, R1-1810203, 3GPP TSG RAN WG1 Meeting #94bis, Oct. 8-12, 2018, Chengdu, China.

European Office Action dated May 9, 2023, issued in European Application No. 20894280.5.

* cited by examiner

METHOD AND APPARATUS FOR DECODING POLAR CODE IN COMMUNICATION AND BROADCASTING SYSTEM

CROSS-REFERENCE TO RELATED APPLICATION(S)

This application is a continuation application, claiming priority under § 365(c), of an International application No. PCT/KR2020/017340, filed on Nov. 30, 2020, which is based on and claims the benefit of a U.S. provisional application Ser. No. 62/941,992, filed on Nov. 29, 2019, in the U.S. Patent and Trademark Office, and of a Korean patent application number 10-2020-0165096, filed on Nov. 30, 2020, in the Korean Intellectual Property Office, the disclosure of each of which is incorporated by reference herein in its entirety.

BACKGROUND

The disclosure relates to a wireless communication system. More particularly, the disclosure relates to a method and an apparatus for providing decoding of a polar code in the wireless communication system.

To meet a demand on wireless data traffic which has been in an increasing trend after a $4^{th}$ generation (4G) communication system was commercialized, there is an ongoing effort to develop an improved 5' generation (5G) communication system or a pre-5G communication system. For this reason, the 5G communication system or the pre-5G communication system is called a beyond 4G network communication system or a post long term evolution (LTE) system.

To achieve a high data transfer rate, the 5G communication system is considered to be implemented in an mmWave band (e.g., such as a 60 GHz band). To reduce a propagation path loss at the mmWave band and to increase a propagation delivery distance, beamforming, massive multiple input multiple output (MIMO), full dimensional MIMO (FD-MIMO), array antenna, analog beam-forming, and large scale antenna techniques are under discussion in the 5G communication system.

In addition, to improve a network of a system, techniques, such as an evolved small cell, an advanced small cell, a cloud radio access network (RAN), an ultra-dense network, device to device (D2D) communication, a wireless backhaul, a moving network, cooperative communication, coordinated multi-points (CoMP), and reception interference cancellation, or the like are being developed in the 5G communication system.

In addition thereto, hybrid frequency shift keying and quadrature amplitude modulation (FQAM) and sliding window superposition coding (SWSC) as an advanced coding modulation (ACM) technique and filter bank multi carrier (FBMC), nonorthogonal multiple access (NOMA), and sparse code multiple access (SCMA), or the like as an advanced access technology are being developed in the 5G system.

In a wireless communication system, when data is transmitted and received between a transmitter and a receiver, a data error may occur due to noise present in a communication channel. In order to allow the receiver to be able to correct the error occurred, there is a coding scheme designed based on, for example, error detection codes and error correcting codes (ECC). Error correcting coding used for communication between the transmitter and the receiver is called channel coding. According to an error correcting code scheme, the transmitter may perform transmission by adding a redundant bit to a data bit to be transmitted, and the receiver may utilize the redundant bit to perform a decoding operation for correcting an error included the data bit to be transmitted.

The error correcting code scheme may include various methods. For example, the error correcting code scheme may include convolutional coding, turbo coding, low-density parity-check (LDPC) coding, and polar coding schemes. More particularly, a turbo code, an LDPC code, and a polar code are excellent codes having performance almost close to theoretical channel capacity and are utilized in various communication systems.

Among the error correcting code schemes, the polar code is a first code theoretically proven as achieving point-to-point channel capacity with low decoding complexity, based on a channel polarization phenomenon which occurs when successive cancellation (SC) decoding occurs [1]. In addition, it has been confirmed that the polar code also has excellent performance when SC-List (SCL) decoding or the like is used. More particularly, when a concatenated outer code, such as a cyclic redundancy check (CRC) code and the SCL decoding are used, it has been confirmed that performance is excellent compared to the existing other channel codes [2]. Accordingly, it has been agreed to use the polar code when control information is transmitted through a control channel in 3 GPP new radio (NR).

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

Aspects of the disclosure are to address at least the above-mentioned problems and/or disadvantages and to provide at least the advantages described below. Accordingly, an aspect of the disclosure is to provide error-correcting codes for correcting and restoring data when an error or erasure occurs or is likely to occur due to various reasons, such as noise, interference, or the like in the process of transmitting and storing the data.

Another aspect of the disclosure is to provide a method, procedure, and an apparatus for achieving suitable error correction capability and error detection capability in the process of transmitting and receiving information in a mobile communication system and a broadcasting system, in association with decoding of a polar code.

Additional aspects will be set forth in part in the description which follows and, in part, will be apparent from the description, or may be learned by practice of the presented embodiments.

Solution to Problem

In accordance with an aspect of the disclosure, a method performed by a receiving end is provided. The method includes receiving a signal from a transmitting end, performing successive cancellation (SC) decoding, based on a log-likelihood ratio (LLR) sequence obtained from the received signal, obtaining an estimated codeword bit sequence by re-encoding an encoding input bit sequence obtained through the decoding, obtaining a decision metric, based on the estimated codeword bit sequence and the LLR sequence, and deciding whether the decoding is successful, based on the obtained decision metric.

In accordance with another aspect of the disclosure, a receiving end is provided. The receiving end includes a control unit, a memory, and a transceiver including a decoding unit. The transceiver may be configured to receive a signal from a transmitting end, perform SC decoding, based on an LLR sequence obtained from the received signal, obtain an estimated codeword bit sequence by re-encoding an encoding input bit sequence obtained through the decoding, obtain a decision metric, based on the estimated codeword bit sequence and the LLR sequence, and decide whether the decoding is successful, based on the obtained decision metric.

In accordance with another aspect of the disclosure, a method performed by a receiving end is provided. The method includes obtaining a code parameter and a code configuration or the like when decoding a codeword encoded into a polar code, based on an input of an LLR or the like obtained from a received signal, estimating an encoding input bit sequence by performing SC-based decoding, based on the obtained code parameter and configuration or the like, obtaining an estimated encoding output bit sequence by re-encoding the estimated encoding input bit sequence, calculating or generating a decision metric, based on a value, such as an LLR or the like generated based on the estimated codeword output bit sequence and the received signal, and checking a validity of a decoding result, based on the obtained decision metric.

Advantageous Effects of Invention

An apparatus and method according to various embodiments of the disclosure provide power error detection performance or erasure decision performance of suitable level. Specifically, an estimated codeword output bit sequence is utilized to obtain a metric based on a Euclidean distance between a received signal and a decoded signal or a correlation calculated by an inner produce between the two, and post error detection is performed based on this.

The Euclidean distance-based metric is an optimal metric value in terms of maximum-likelihood (ML) which may be utilized by a receiver, and an embodiment of the disclosure in which the metric is utilized allows to achieve more excellent post error detection performance than the post error detection scheme of the related art using a path metric.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

BEST MODE FOR CARRYING OUT THE INVENTION

Figure 1:
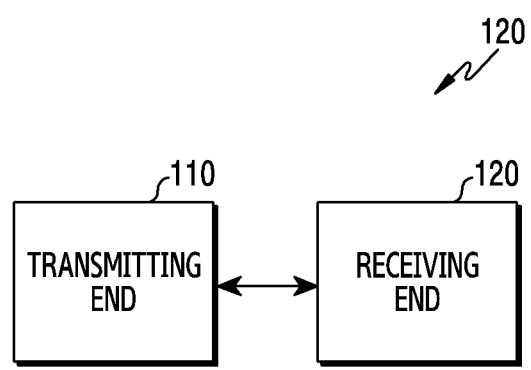
FIG. 1 illustrates a polar code encoding of a transceiver in a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In describing the embodiments of the disclosure, descriptions which are well known in the technical field to which the disclosure belongs and are not related directly to the disclosure will be omitted. This is to convey the disclosure more clearly by omitting unnecessary description.

For the same reason, some components may be exaggerated, omitted, or schematically illustrated in the accompanying drawings. In addition, a size of each component does not completely reflect an actual size. In the drawings, like reference numerals denote like or corresponding components.

Advantages and features of the disclosure and methods of accomplishing the same may be understood more clearly by reference to the following detailed description of the embodiments and the accompanying drawings. However, the disclosure is not limited to embodiments disclosed below, and may be implemented in various forms. Rather, the embodiments are provided to complete the disclosure and to fully convey the concept of the disclosure to one of those ordinarily skilled in the art, and the disclosure will only be defined by the scope of claims. Throughout the specification, like reference numerals denote like components.

In this case, it will be understood that blocks of processing flow diagrams and combinations of the flow diagrams may be performed by computer program instructions. Since these computer program instructions may be loaded into a processor of a general purpose computer, a special purpose computer, or another programmable data processing apparatus, the instructions, which are performed by a processor of a computer or another programmable data processing apparatus, create a means for performing functions described in the block(s) of the flow diagram. The computer program instructions may be stored in a computer-usable or computer-readable memory capable of directing a computer or another programmable data processing apparatus to implement a function in a particular manner, and thus the instructions stored in the computer-usable or computer-readable memory may also be capable of producing manufacturing items containing an instruction means for performing the functions described in the block(s) of the flow diagram. The computer program instructions may also be loaded into a computer or another programmable data processing apparatus, and thus, instructions for operating the computer or another programmable data processing apparatus by generating a computer-executed process when a series of operations are performed in the computer or another programmable data processing apparatus may provide operations for performing the functions described in the block(s) of the flow diagram.

In addition, each block may represent part of a module, segment, or code which includes one or more executable instructions for executing specified logical function(s). It should also be noted that in some alternative implementations, functions mentioned in blocks may occur not in an orderly manner. For example, two blocks illustrated successively may actually be executed substantially concurrently, or the blocks may sometimes be performed in a reverse order according to corresponding functions.

The term 'unit' used herein means a software or hardware component, such as a field programmable gate array (FPGA) or application specific integrated circuit (ASIC), which performs certain tasks. However, the 'unit' is not limited to the software or hardware component. The 'unit' may be configured to reside on an addressable storage medium and configured to execute on one or more processors. Thus, for example, the 'unit' may include components, such as software components, object-oriented software components, class components, and task components, processes, functions, attributes, procedures, subroutines, segments of program code, drivers, firmware, microcode, circuitry, data, databases, data structures, tables, arrays, and variables. The functionality provided in the components and 'units' may be combined into fewer components or further separated into additional components and units. In addition thereto, the components and units may be implemented to reproduce one or more central processing units (CPUs) included in a device or a security multimedia card.

Hereinafter, embodiments of the disclosure are described with reference to the accompanying drawings. In this case, it should be noted that like reference numerals denote like constitutional elements in the accompanying drawings. In addition, it should be noted that the drawings of the disclosure attached below are provided to help the understanding of the disclosure, and the disclosure is not limited to the form or arrangement illustrated in the drawings of the disclosure. In addition, descriptions of well-known functions or constructions will be omitted since they would obscure the disclosure in unnecessary detail. It should be noted that in the following description, only parts necessary to understand operations according to various embodiments of the disclosure will be described, and descriptions of other parts will be omitted so as not to obscure the disclosure in unnecessary detail.

FIG. 1 illustrates polar code encoding of a transceiver in a wireless communication system according to an embodiment of the disclosure.

Referring to FIG. 1, a transmitting end 110 and a receiving end 120 are exemplified as part of a device or nodes using a wireless channel in the wireless communication system of FIG. 1. Although one transmitting end 110 and one receiving end 120 are illustrated in FIG. 1, a plurality of transmitting ends or a plurality of receiving ends may be included. In addition, although the transmitting end 110 and the receiving end 120 are described as separate entities in the disclosure for convenience of explanation, functions of the transmitting end 110 and receiving end 120 are interchangeable. For example, in an uplink case of a cellular communication system, the transmitting end 110 may be a terminal, and the receiving end 120 may be a base station. In a downlink case, the transmitting end 110 may be the base station, and the receiving end 120 may be the terminal.

In various embodiments of the disclosure, the transmitting end 110 may generate a codeword by encoding information bits, based on an LDPC code, and the receiving end 120 may decode the received codeword, based on the LDPC code. For example, the receiving end 120 may use a layered scheduling scheme, and may perform a syndrome check. The transmitting end 110 and the receiving end 120 perform LDPC coding and decoding by using a parity check matrix known to each other. For example, the parity check matrix may include a parity check matrix defined in a $5^{th}$ generation (5G) new radio (NR) standard.

Figure 2:
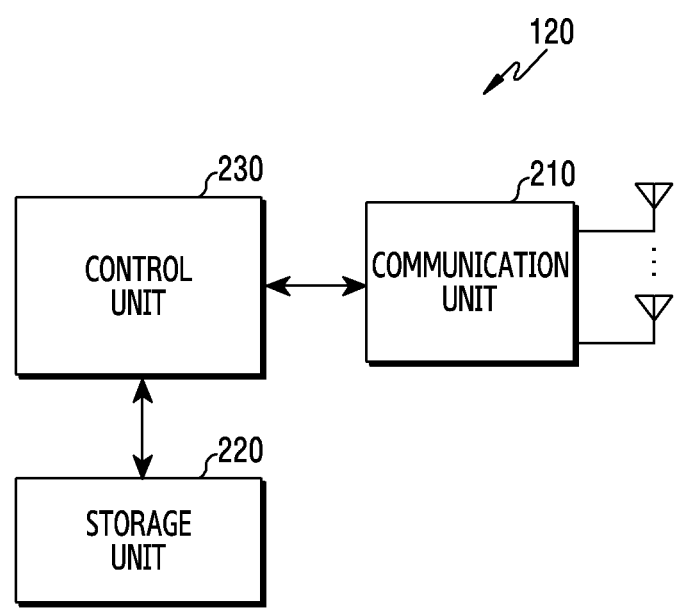
FIG. 2 illustrates a structure of a device for performing communication in a wireless communication system according to an embodiment of the disclosure.

FIG. 2 illustrates a structure of a device for performing communication in a wireless communication system according to an embodiment of the disclosure.

Referring to FIG. 2, the structure may be understood as a structure of the receiving end 120. Hereinafter, the term ' . . . unit', ' . . . device', or the like implies a unit of processing at least one function or operation, and may be implemented in hardware or software or in combination of the hardware and the software. Referring to FIG. 2, the device may include a communication unit 210, a storage unit 220, and a control unit 230.

The communication unit 210 may perform functions for transmitting and receiving a signal through a wireless channel. For example, the communication unit 210 may perform a function of conversion between a baseband signal and a bit-stream according to a physical layer standard of a system. For example, in data transmission, the communication unit 210 may generate complex symbols by coding and modulating a transmission bit-stream. In addition, in data reception, the communication unit 210 may restore a received bit-stream by demodulating and decoding a baseband signal. In addition, the communication unit 210 may up-convert a baseband signal into a radio frequency (RF) signal and thereafter transmits it through an antenna, and may down-convert an RF signal received through the antenna into a baseband signal.

To this end, the communication unit 210 may include a transmission filter, a reception filter, an amplifier, a mixer, an oscillator, a digital to analog converter (DAC), an analog to digital converter (ADC), or the like. In addition, the communication unit 210 may include a plurality of transmission/reception paths. Further, the communication unit 210 may include at least one antenna array constructed of a plurality of antenna elements. From a hardware aspect, the communication unit 210 may be constructed of a digital unit and an analog unit, and the analog unit may be constructed of a plurality of sub-units according to operating power, operation frequency, or the like. In addition, the communication unit 210 may include a decoding unit to perform decoding according to various embodiments of the disclosure.

The communication unit 210 transmits and receives a signal as described above. Accordingly, the communication unit 210 may be referred to as a 'transmitter', a 'receiver', or a 'transceiver'. In addition, in the following description, transmission and reception performed through a wireless channel are used to imply that the aforementioned processing is performed by the communication unit 210. In addition, if the device of FIG. 2 is a base station, the communication unit 210 may further include a backhaul communication unit for communication between other network entities coupled to a backhaul network.

The storage unit 220 may store data, such as a basic program, application program, configuration information, or the like for an operation of the receiving end 120. The storage unit 220 may be constructed of a volatile memory, a non-volatile memory, or a combination of the volatile memory and the non-volatile memory. In addition, the storage unit 220 may provide the stored data according to a request of the control unit 230.

The control unit 230 may control overall operations of the device. For example, the control unit 230 may transmit and receive a signal via the communication unit 210. In addition, the control unit 230 may write data to the storage unit 220 or and read the data. To this end, the control unit 230 may include at least one processor or micro-processor, or may be part of the processor. According to various embodiments of the disclosure, the control unit 230 may control the device to perform operations based on various embodiments described below.

In a wireless communication system, a decoder included in a receiver may perform decoding based on an input signal to correct errors which may occur in communication and broadcasting systems. However, in an environment of the communication and broadcasting systems, there may be situation in which the decoder performs decoding based on an unintended signal, or although decoding is performed by receiving a normal signal, a decoding result is different from actually transmitted information. For example, in an environment, such as discontinuous transmission (DTX) in a communication system, the decoder may perform decoding by taking noise generated in the system as an input even if there is no actually transmitted signal. In another example, in an environment, such as blind detection in the communication system, the decoder may perform decoding by taking an arbitrary signal other than an actually expected signal as an input. In another example, even if the decoder performs decoding by receiving a scheduled signal, a final decoding result may be different from the actually transmitted information.

When decoding is performed on noise, random signals, or the like other than an actual signal, the decoder may report a decoding failure. In addition, even if the receiver receives a signal and thus performs decoding thereon, the decoder may report a decoding failure when it is restored or decoded with information other than the actually transmitted information. As such when the decoder determines a decoding success or failure based on a decoding result and a given environment before or after decoding, it may be referred to as a decoding result validity check, a post error detection, or an erasure decision.

A method of checking a validity of a decoding result may include a method of performing a syndrome-check based on a structure of a channel code in use, a method of utilizing a concatenated error detection code, such as a CRC code, and a method of utilizing a metric to be obtained during decoding. The method of utilizing the syndrome-check may be a method of identifying whether an estimated codeword bit sequence obtained by decoding satisfies all linear constraints configured by a channel code. The method of utilizing the concatenated error detection code, such as the CRC code may be a method of checking an estimated bit sequence obtained after decoding with the concatenated error detection code. The method of utilizing the metric to be obtained during decoding may be a method of determining whether an error exists by identifying whether a metric value generated in the decoder is greater than a predetermined threshold. The aforementioned method of checking the validity of the decoding result may be selected according to a feature of a channel code used by the transmitter and receiver in the system.

The transmitter and receiver according to various embodiments of the disclosure may relate to communication and broadcasting systems using a polar code. The polar code is a channel code in which it is difficult to use the syndrome-check due to an SC-based decoding operation and coding structure. In the communication and broadcasting systems using the polar code, the validity check of the decoding result may be performed by utilizing the concatenated error detection code, such as a CRC code and a path-metric (PM) generated during decoding. However, if a length of the CRC code is short or an input and output length of the code is short, there may be a limit in error detection performance when using only the method of utilizing the CRC code and the PM generated during decoding. Accordingly, various embodiments of the disclosure provide a method of checking a validity of a decoding result by generating a more accurate metric.

A polar code is an error-correcting code proposed by E. Arikan in 2008, and is a first error-correcting code proved to achieve channel capacity which is a data transmission limit in all binary discrete memoryless channels (B-DMCs) while having low coding/complexity performance [1]. The polar code has an advantage in error-correcting performance and decoding complexity when a short-length code is transmitted, compared to other channel capacity-approaching codes, i.e., a turbo code and a low-density parity-check (LDPC) code. Due to this advantage, the polar code is used in 3GPP NR which is a $5^{th}$ generation (5G) mobile communication standard to transmit control information having a short length.

In order to describe embodiments of the disclosure, basic operations of encoding and decoding using a polar code will be described. FIG. 1 illustrates an example of a polar code encoding process performed by a transmitter in communication and broadcasting systems. In this operation, the process may be omitted in part according to a system requirement and feature, or an additional operation may be added. The number of information bits to be transmitted by the transmitter is denoted by A, and the number of codeword bits to be encoded and transmitted through a channel is denoted by E. Operations of the encoding process performed by the transmitter will be described below with reference to FIG. 1.

Figure 3:
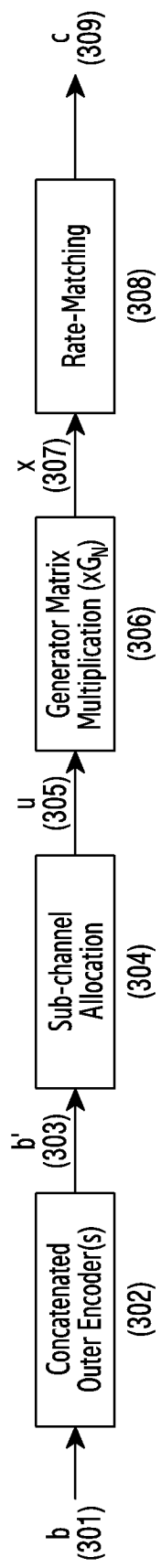
FIG. 3 illustrates a decoding result validity check based on a path metric (PM) after polar code decoding according to an embodiment of the disclosure.

FIG. 3 illustrates a decoding result validity check based on a path metric (PM) after polar code decoding according to an embodiment of the disclosure.

Referring to FIG. 3, a transmitter may first generate an information bit sequence. Referring to FIG. 3, a length—A information bit sequence $b=\{b_0, b_1, \ldots, b_{A-1}\}$ 301 to be transmitted is generated. The information bit sequence may be part, e.g., a segment, of the entire information to be transmitted.

In operation 302, the transmitter may perform an outer code operation. The information bit sequence b 301 is first encoded into a concatenated outer code to improve performance (see operation 302). In general, the outer code is used to improve performance of a decoder which proceeds decoding by considering a plurality of codeword candidate groups as in an SC-List (SCL) decoding of a polar code [2]. The SCL decoding will be described below in an operation of a receiver. Examples of the outer code used in concatenation with the polar code for this purpose include an error detection code, such as a cyclic redundancy check (CRC) code or an error correcting code, such as a bose-chaudhuri-hocquenghem (BCH) code, a parity check (PC) code, a convolutional code, or the like. Only one outer code may be used, or two or more outer codes may be used in combination. For example, according to a length of an information bit, a polar code used for uplink control information among polar codes defined in 3GPP NR uses only an 11-bit CRC code if the information bit length is greater than or equal to 20 bits, and uses a 3-bit PC code and a 6-bit CRC code together if the information bit length is less than or equal to 19 bits [3]. In general, this outer coding is a method of adding a parity bit to an input bit sequence, as a systematic code. A length of all parity bits generated by one or more outer codes is denoted by B, and a length of a codeword generated by the outer coding is denoted by K=A+B. In addition, a bit sequence generated as a result of the outer coding is denoted by a $b'=\{b'_0, b'_1, \ldots, b'_{K-1}\}$ 303. Since the outer coding is not an essential operation for polar code encoding itself, if the outer coding is not considered, B=0 and b'=b.

In operation 104, the transmitter may perform sub-channel allocation. The bit sequence b' 303 may be mapped to a length-N bit sequence $u=\{u_0, u_1, \ldots, u_{N-1}\}$ 305 for polar code encoding. Herein, N is a power of 2 as a size of a mother polar code, and may be determined by a predetermined criterion among values greater than K. The bit sequence u 305 is called an input bit sequence of a poler code encoder, and bits of b' may be mapped to u according to a predetermined method and criterion (see operation 304). Each bit of the encoding input bit sequence u may be interpreted as if it passes through a split channel (or sub-channel) which is a virtual channel of different quality at a later time due to channel polarization caused by an operation of the transmitter and receiver. In this case, each sub-channel is also called a synthetic channel Therefore, in order to map the bits of b' to bits of u passing through a sub-channel of excellent quality, each sub-channel's channel capacity, a Bhatacharayya parameter, a result of density evolution, or the like may be used. In addition, a rate-matching operation to be performed at a later time may be considered in this process. Due to such a characteristic, a process of mapping b' to u is called a process of sub-channel allocation (see operation 304). In this process, a bit of u corresponding to the sub-channel to which b' is mapped is often called an unfrozen bit, and a bit of u corresponding to the remaining sub-channels is called a frozen bit. The frozen bit has a fixed value as its name suggests, and a value thereof is 0 in general.

In operation 106, the transmitter may perform generator matrix multiplication. The length—N encoding input bit sequence u is multiplied by a generator matrix G of a polar code (see operation 306) to generate a codeword output bit sequence $x=(x_0, x_1, \ldots, x_{N-1})$ 307 of the same length N. When a polar code was first proposed by Arikan, the generator matrix G was defined by Equation 1 below.

$$G = B_N F^{\otimes log2N} \quad \text{Equation 1}$$

In the equation above, $$F = \begin{bmatrix} 1 & 0 \\ 1 & 1 \end{bmatrix},$$

and an operation $\otimes$ n in a superscript means $B_N$ Kronecker powers. For example, $$F^{\otimes 2} = \begin{bmatrix} F & 0 \\ F & F \end{bmatrix}, \text{ and } F^{\otimes 3} = \begin{bmatrix} F^{\otimes 2} & 0 \\ F^{\otimes 2} & F^{\otimes 2} \end{bmatrix}.$$

In addition, $B_N$ is a bit-reversal permutation matrix of a size N×N. For example, a length-8 vector $\{a_0, a_1, a_2, a_3, a_4, a_5, a_6, a_7\}$ and an 8×8 bit-reversal permutation matrix $B_8$ are multiplied to obtain $\{a_0, a_4, a_2, a_6, a_1, a_5, a_3, a_7\}$ in which an index is bit-reversal permutated. However, recently, a generator matrix of Equation 2 in a simple form except for $B_N$ is considered in various documents and systems including 3GPP NR.

$$G = F^{\otimes log2N} \quad \text{Equation 2}$$

Unless otherwise specified, a generator matrix defined as $G=F^{\otimes log2N}$ is assumed hereinafter. It should be noted that the content described under this assumption may be described by being easily changed to a polar code using a generator matrix defined as $G=B_N F^{\otimes log2N}$ based on a bit-reversal permutation operation.

A process of generating a length-E bit sequence to be transmitted from the generated codeword output bit sequence $x=(x_0, x_1, \ldots, x_{N-1})$ 307 is called rate-matching (see operation 308). A transmission bit sequence obtained through the rate-matching is expressed as a $c=(c_0, c_1, \ldots, c_{E-1})$ 309. The codeword output bit sequence x 307 may be re-matched to improve performance of a polar code according to the rate-matching. As an example, in the 3GPP NR polar coding system, the codeword output bit sequence x 307 may be interleaved in units of 32 sub-blocks and stored in a circular buffer, and may be sequentially extracted to generate the length-E codeword sequence. If the codeword length E is less than a size E of a mother polar code, one of puncturing and shortening operations may be performed. If some bits of the codeword output bit sequence x 307 are punctured, some of sub-channels experienced by the encoding input bit sequence u 305 are incapable, and a sub-channel allocation process may be achieved by considering such an incapable bit. If some bits of the codeword output bit sequence x 307 are to be shortened, some bits of the encoding input bit sequence u 305 shall also be shortened, and the sub-channel allocation process may be achieved by considering such a shortening bit. On the other hand, if the codeword length E is greater than the size E of the mother polar code, repetition may be performed.

Figure 4:
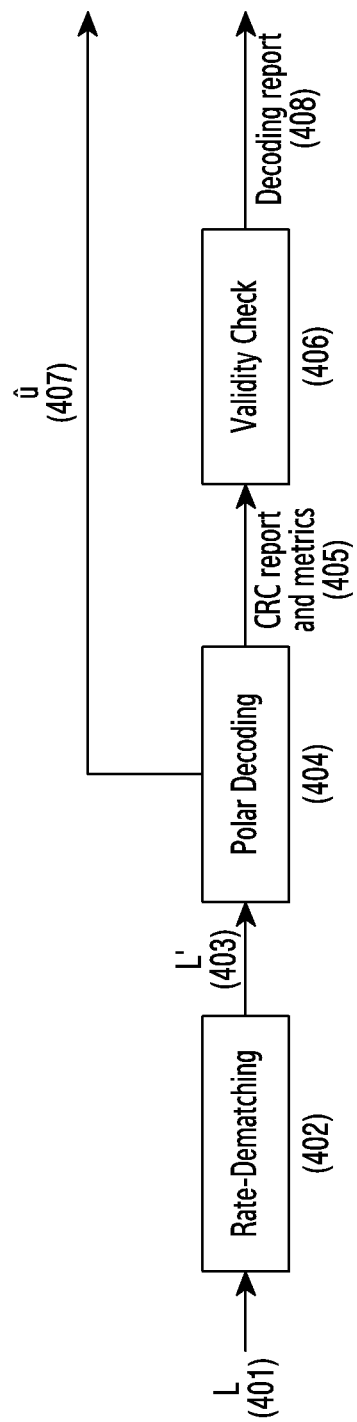
FIG. 4 illustrates a polar code aided decoding of a receiver in a wireless communication system according to an embodiment of the disclosure.

FIG. 4 illustrates a polar code aided decoding of a receiver in a wireless communication system according to an embodiment of the disclosure.

Referring to FIG. 4, it illustrates a process in which a receiver decodes a signal transmitted through the process of FIG. 3. In this operation, an additional operation may be added or an included operation may be omitted according to a system requirement or the like.

A receiver may generate a demodulated LLR. The receiver may obtain probability information corresponding to the bit c 309 transmitted by demodulating the received signal. The probability information is given as a value, such as a likelihood ratio (LR), a log-likelihood ratio (LLR), or the like. Hereinafter, for simple explanation, the LLR is considered unless otherwise specified. However, it should be noted that the disclosure is not limited to an LLR-based receiver. Hereinafter, an LLR sequence corresponding to the transmission bit sequence c309 is denoted by L= $\{l_0, l_1, \ldots, l_{E-1}\}$ 401.

In operation 402, the receiver may perform a rate-dematching process. The receiver may perform a reverse process of rate-matching of the transmitter so that the length-E LLR sequence L is input to a length-N polar code decoder. If puncturing occurs at a rate matching end of the transmitter, an LLR value for a corresponding bit may be determined to be 0, and if shortening occurs, the LLR value for the corresponding bit may be determined to a maximum value of an LLR value corresponding to a bit value 0. If repetition occurs for a specific bit, the receiver may determine an LLR value for a corresponding bit by combining all corresponding LLR values. The length-N LLR sequence determined through such a process is expressed by $L'=\{l'_0, l'_1, \ldots, l'_{N-1}\}$ 403.

In operation 404, the receiver may perform outer code aided SC-based decoding. The operation 404 may be an operation to be performed by the decoder included in the receiver. When the length—N LLR sequence L' is calculated or determined, the receiver may perform the SC-based decoding based thereon. Examples of the SC-based decoding scheme include normal SC decoding, SC-list (SCL) decoding, SC-stack (SCS) decoding, or the like. The SC-based decoding is characterized in that each bit of an encoding input sequence is sequentially decoded one by one according to an index order. These decoders perform decoding on each bit in order of an index value of the encoding input bit sequence, i.e., in order of $u_0, u_1, \ldots, u_{N-1}$. Specifically, decoding for an i-th bit $u_i$ is achieved according to the following procedure.

î Calculate a probability-based matric for 0 and 1 of a value $u_i$, based on a received signal and estimated values $\hat{u}_0, \hat{u}_1, \ldots, \hat{u}_{i-1}$ of previously decoded bits.

2̂ Estimate a bit value $\hat{u}_i$, based on the calculated probability-based metric.

3̂ Apply the estimated value $\hat{u}_i$ to the decoder, based on successive cancelation, to decode a next bit.

As described above, decoding for each bit may be achieved based on a bit value which has been previously decoded and estimated. For example, when the bit $u_i$ is decoded, estimated values $\hat{u}_0, \ldots, \hat{u}_{i-1}$ for previously decoded bits $\hat{u}_0, \hat{u}_{i-1}$ and probability information thereon or an accumulative value of values corresponding to the probability information may be used. Herein, each partial bit sequence $\hat{u}_0, \ldots, \hat{u}_{i-1}$ is called a list or a path, and probability information accumulated while performing decoding on each path or a value corresponding to the probability in formation is called a path-metric (PM). The SCL decoder proceeds decoding while maintaining L lists $\hat{u}_0, \ldots, \hat{u}_{i-1}$ where L is a list size determined when the bit $u_i$ is decoded. For example, the SCL decoder may calculate probability information for 0 and 1 of the value $u_i$, based on the lists $\hat{u}_0, \ldots, \hat{u}_{i-1}$ maintained up to now in the decoding. In addition, probability information of 0 and 1 of the bit value $u_i$ or a value corresponding to the probability information is updated in a PM for each list $\hat{u}_0, \ldots, \hat{u}_{i-1}$ considered when probability information of each $u_i$ is calculated, thereby calculating a PM for 2L lists $\hat{u}_0, \ldots, u_{i-1}, \{0 \text{ or } 1\}$. This value may be calculated using various methods, and a method proposed in [4] is used in general. According to this method, the lower the PM value, the higher the probability of a bit sequence corresponding to a corresponding list. A set of a PM for L lists is expressed by $\{PM_k\}_{k=1,\ldots,L}$. If $u_i$ is a frozen bit, the estimated value $\hat{u}_i$ is determined to a predetermined bit value mutually agreed by the transmitter and the receiver irrespective of the calculated PM. If $u_i$ corresponds to an information bit among unfrozen bits, the receiver selects L lists $\hat{u}_0, \ldots, \hat{u}_{i-1}, \hat{u}_i$ decided as having a high probability, based on a PM value among 2L lists. The SCL decoder proceeds decoding while maintaining L lists whenever each bit is decoded in this manner. In addition, upon completion of decoding of all bits, the SCL decoder selects a codeword having a highest probability based on a PM among L lists obtained finally. As described above, the SCL decoder estimates a list having a lowest PM value as a final encoding input bit sequence $\hat{u}=(\hat{u}_0, \ldots, \hat{u}_{N-1})$. If L is set to 1, the SCL decoder operates identically to a basic SC decoder. Concatenated outer coding may be utilized in the middle of or after the completion of the SCL decoding to improve error correction performance of the receiver. For example, when the CRC code is used in concatenation, the receiver estimates a codeword having a highest probability while satisfying a CRC code constraint condition among the L lists obtained after the decoding, as a final decoding result. After the aforementioned series of decoding operations, a CRC check result and a metric value including a PM or the like of each list, and an estimated coding input bit sequence $\hat{u}=(\hat{u}_0, \ldots, \hat{u}_{N-1})$ 407 are obtained.

In operation 406, the receiver may perform a decoding validity check. The receiver checks a validity (see operation 406), based on a variety of decoding results 405 obtained in the operation 404. This process may be referred to as decoding validity check, post error detection, erasure decision, or the like. If the CRC code is concatenated and the receiver utilizes a CRC check to select a final list in the SCL decoding, this result is basically utilized in the decoding validity check. If there is no list which has passed the CRC check, the receiver immediately reports 408 a decoding failure, and ends the series of decoding processes. If there is a list which has passed the CRC check, the receiver may immediately output $\hat{u}=(\hat{u}_0, \ldots, \hat{u}_{N-1})$ as a decoding result, and instead of reporting a decoding success, may perform a metric-based additional validity check to improve decoding validity check performance. Such decoding validity check methods will be described below in greater detail. If it is decided that decoding has failed in the decoding validity check process, a decoding failure is reported and a decoding procedure ends. If it is decided that decoding has succeed in the decoding validity check process, the receiver reports a decoding success and proceeds a follow-up procedure, such as outputting $\hat{u}=(\hat{u}_0, \ldots, \hat{u}_{N-1})$. Examples of the follow-up procedure include a process of extracting a message bit sequence $\hat{b}=(\hat{b}_0, \ldots, \hat{b}_{A-1})$ mapped to $\hat{u}$ and a process of obtaining an estimated codeword bit sequence $\hat{c}=(\hat{c}_0, \ldots, \hat{c}_{E-1})$ by re-encoding $\hat{u}$ for a successive interference cancellation (SIC) operation of a multiple-input multiple-output (MIMO) system.

Figure 5:
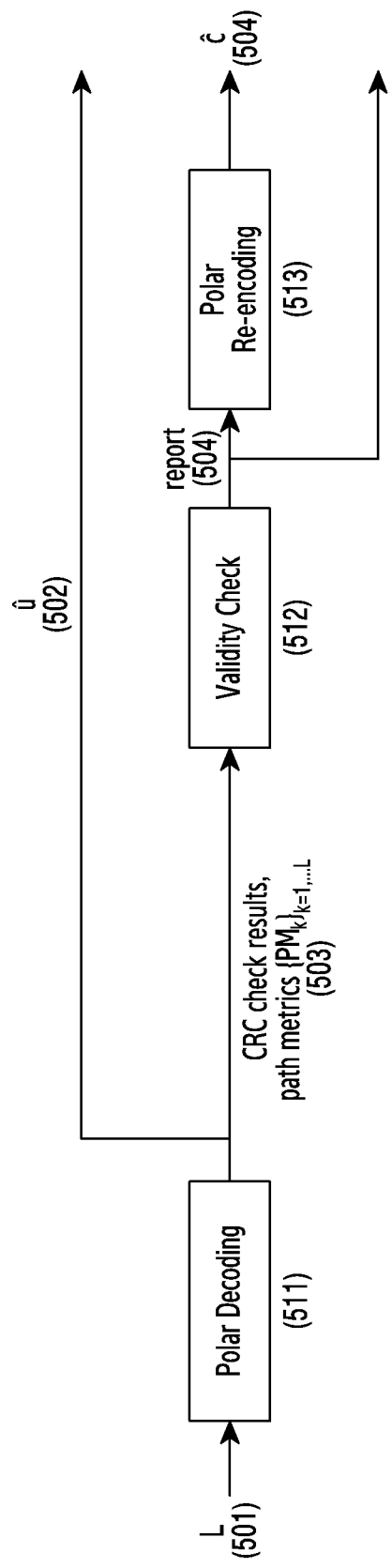
FIG. 5 illustrates a polar code aided decoding of a receiver in a wireless communication system according to an embodiment of the disclosure.

FIG. 5 illustrates a polar code aided decoding of a receiver in a wireless communication system according to an embodiment of the disclosure.

A method of additionally a decoding result validity check in addition to a CRC check result during the decoding process will be described. In the method of the related art, the receiver checks a decoding validity by using an absolute or relative difference between PM values generated in SCL decoding as a criterion.

Referring to FIG. 5, a process of generating a decision matric, based on an SCL decoding process of the receiver and a generated PM, is illustrated.

In operation 511, the receiver may perform SCL decoding of a polar code according to the process of FIG. 4, by using an LLR sequence L 501 as an input. As a decoding result 504, CRC check results and all or at least some (maximum, minimum, etc.) of values of a set of PMs in a list, i.e., $\{PM_k\}_{k=1, \ldots, L}$ 503 are obtained. If it is decided that decoding has succeeded in the SCL decoding operation through the CRC check, or the like, an estimated encoding input bit sequence $\hat{u}$ is also obtained together in operation 502. If a CRC check result of all lists is a failure, the receiver may report a decoding failure. The estimated encoding input bit sequence $\hat{u}$ to be output when the receiver fails in the decoding may be determined according to a configuration of the decoder, and may be a random sequence, a predetermined sequence, or a list having a highest probability among lists even if the CRC check has failed. If the CRC check result is a success, an additional decoding validity check may be performed based on a given path metric $\{PM_k\}_{k=1}, \ldots, L$ or some of maximum/minimum values thereof (see operation 512). Representative examples of the method of the related art may be the method proposed in [5] and [6]. First, in [5], a decision metric is calculated as in the following equation, based on the given path metric $\{PM_k\}_{k=1}, \ldots, L$.

$$\text{Decision metric} = \frac{PM_{max} - PM_{min}}{PM_{min}} \quad \text{Equation 3}$$

In Equation 3 above, $PM_{max}$ denotes a maximum value of all path metrics, and $PM_{min}$ denotes a minimum value of all path metrics. If a decision metric value of Equation 3 is less than a predetermined threshold (e.g., 1/32), the receiver decides that the decoding result is not valid, and proceeds a follow-up procedure depending thereon, for example, reporting the decoding failure. If the metric value is greater than the predetermined threshold, the receiver decides that the decoding result is valid, and performs a follow-up procedure, for example, reporting the decoding success and outputting $\hat{u}$ obtained from SCL decoding. Otherwise, in [6], the decision metric is calculated in a slightly different manner as in the following equation.

$$\text{Decision metric} = \frac{PM_{max} - PM'_{min}}{PM_{max}} \quad \text{Equation 4}$$

In Equation 4, $PM'_{min}$ denotes a minimum value among PMs of lists which have passed an outer coding check, such as a CRC check or the like. Only when this value is greater than a predetermined threshold, the receiver may decide that the recoding result is valid, and performs a follow-up operation depending thereon. The follow-up operation may include re-encoding (see operation 513) performed for successive interference cancellation to improve performance in a MIMO system.

When the receiver fails in the decoding, encoding input bit sequences of all lists obtained finally may be almost the same as a random sequence. This is caused by error propagation which occurs in SC-based decoding. Specifically, this is because, if a low-index bit has low reliability and if a decoding result of a bit with low reliability and index value is incorrect, it may be regarded that subsequent bits are determined randomly. In this case, a path matric for a random sequence may be expected to have approximately a similar value. Therefore, if a decision metric for a difference between a maximum value and minimum value of the path metric is small as in Equation 3 or Equation 4, a decoding failure may be suspected in practice.

However, the method of the related art has the following problems. First, the path metric is calculated based on the LLR value calculated by the polar code decoder, and this LLR value is calculated through approximation in a normal implementation. In addition, a path metric value is calculated in an accumulated manner according to a successive decoding process of SC-based decoding, and approximation also occurs in the accumulation of these values in a normal implementation. An error caused by the approximation may have a negative effect on the decoding validity check. Second, the above estimated fact that "path metrics of all lists will have similar values if decoding has failed" is true by the law of large numbers when a length of a polar code in use (a length of a codeword bit sequence) and a dimension thereof (a length of a bit sequence to be encoded) are long. This is because, when decoding fails, the path metric is a sum of LLRs which are random variables having similar values. On the contrary, when the length and dimension of the polar code are small, since a variance of PM values of the lists increases, the above estimated content may not be true. Therefore, more particularly, in case of a short-length code, performance of a PM-based additional decoding validity check may decrease.

In 3GPP NR which is a 5G communication standard, a polar code is used when control information is transmitted. Considering that length of the control information is short in general, the PM-based decoding validity check may be vulnerable in terms of performance. More particularly, control information channels (a physical uplink control cHannel (PUCCH), an uplink control information (UCI) on physical uplink shared cHannel (PUSCH), a physical downlink control cHannel (PDCCH)) for transmitting the control information are exposed to more various error environments than a data channel (a PUSCH, a PDSCH), and have relatively higher error detection requirements than other channels, which may further exacerbate a corresponding problem. For example, a situation often referred to as discontinuous transmission (DTX) may occur in the PUCCH and the PUSCH. This situation may mean a case where a terminal fails to receive and decode a signal transmitted from a base station and thus does not transmit any signal thereafter, but the base station decides that the signal is received and attempts decoding. For example, in the DTX environment, the base station may decide noise or the like occurred by various causes as a received signal, and a decoder may attempt to decode this signal. The DTX environment may be determined through a signal-to-noise ratio (SNR), or the like. Otherwise, however, when decoding is attempted, there may be a case where decoding succeeds by chance. In addition, the receiver may perform blind detection in which decoding is performed by assuming the received signal as various code parameters in a PDCCH, a physical broadcast channel (PBCH), or the like. In case of the blind detection, since it is the same that the decoder decodes an encoded signal by using a plurality of pieces of arbitrary data, likewise, a probability that decoding succeeds by change also increases.

The path metric-based method has a problem in that validity check performance is degraded when a code length and dimension are small. Various embodiments according to the disclosure consider a method of effectively generating a metric with higher accuracy and performing a validity check based thereon.

Figure 6:
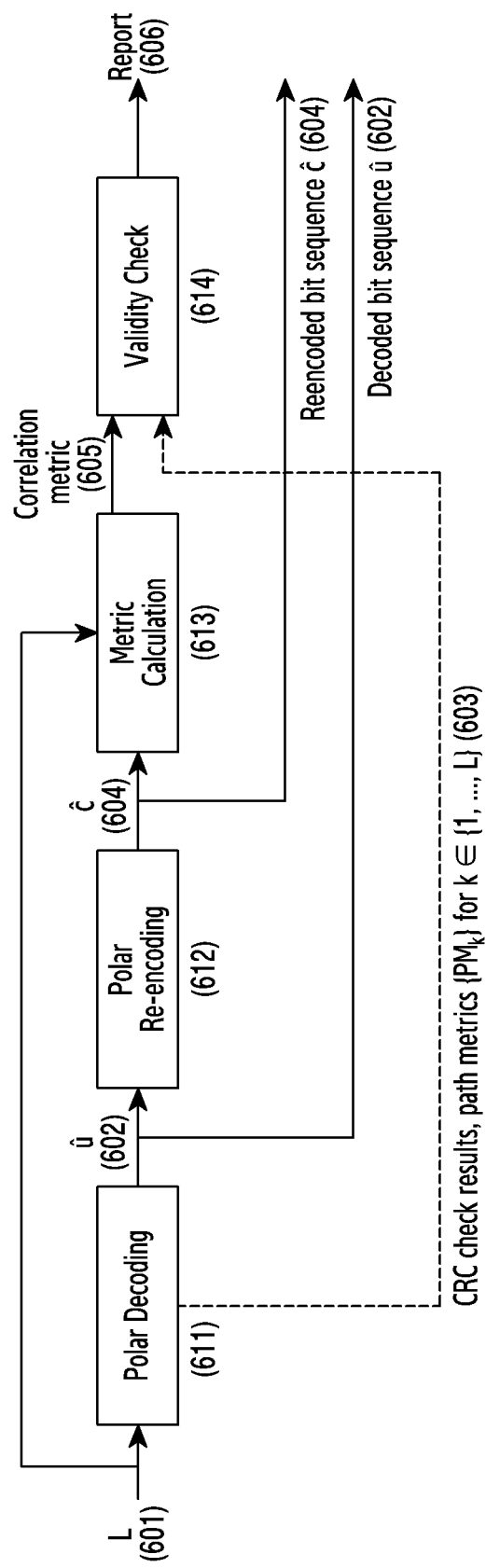
FIG. 6 illustrates a polar code decoding and validity check of a receiver according to an embodiment of the disclosure.

FIG. 6 illustrates a polar code decoding and validity check of a receiver according to an embodiment of the disclosure. The receiver according to the following description may be the receiving end 120 of FIG. 1 and the device of FIG. 2.

Referring to FIG. in operation 611, the receiver may perform decoding of a polar code, based on a given LLR sequence $L=(l_0, l_1, \ldots, l_{E-1})$ 601. Alternatively, although not shown in the drawing, in an embodiment of the disclosure, the receiver may perform decoding of the polar code, based on the LLR sequence $L'=(l'_0, l'_1, \ldots, l'_{N-1})$ obtained according to a result of performing the operation 402 of FIG. 4.

As a result of the decoding performed in operation 611, the receiver may obtain an estimated encoding input bit sequence û 602, a CRC check result 603, all or at least some (maximum, minimum, etc.) of values of a set of PMs in a list, i.e., $\{PM_k\}_{k=1}, \ldots, L$.

When it is decided that the decoding fails through a check based on outer coding, such as a CRC code, a PC code, or the like, the receiver may end a follow-up procedure and report a decoding failure. The estimated encoding input bit sequence û to be output when the receiver fails in decoding may be determined according to a configuration of the decoder in the receiver. The estimated encoding input bit sequence it may be at least one of a random sequence, a predetermined sequence, and a list having a highest probability among lists even if a check based on a CRC code fails.

If the CRC check result is a success, in operation 612, the receiver may re-encode the estimated encoding input bit sequence û which is the decoding result. Although not shown in the drawing, in an embodiment of the disclosure, $\hat{x}=(\hat{x}_0, \hat{x}_1, \ldots, \hat{x}_{N-1})=\hat{u}G$ may be obtained according to the operation of the SCL decoder of the polar code [2]. Based on this, the receiver may obtain an estimated codeword bit sequence $\hat{c}=(c_0, c_1, \ldots, c_{E-1})$ 604 which is a re-encoding result. A re-encoding process may include some or all of operations performed in the decoder of the transmitter, for example, multiplication with the generator matrix G, rate-matching, channel interleaving, or the like.

The re-encoding may be initially performed for successive interference cancellation (SIC) in a multiple input multiple output (MIMO) system regardless of the purpose of the disclosure, and may be an operation performed by default in various communication and broadcasting systems. For example, embodiments according to the disclosure may be effectively implemented in a system in which the re-encoding is performed.

In operation 613, the receiver may calculate a correlation metric value τ 605 by using the estimated codeword bit sequence $\hat{c}=(c_0, c_1, \ldots, c_{E-1})$ obtained through the re-encoding and the LLR sequence $L=(l_0, l_1, \ldots, l_{E-1})$ given as an input of the decoder (see operation 613). This value may be calculated based on the following equation.

$$\tau = \sum_{i=0}^{E-1} (-1)^{\hat{c}_i} \cdot l_i \qquad \text{Equation 5}$$

In Equation 5, T denotes a decision metric, E denotes a codeword length, $\hat{c}_i$ denotes an i-th bit of the estimated codeword bit sequence, and $l_i$ denotes an i-th bit of the LLR sequence $L=(l_0, l_1, \ldots, l_{E-1})$ given as an input of the decoder.

For convenience, the correlation metric may be normalized to a codeword length as shown in the following equation.

$$\tau = \frac{1}{E}\sum_{i=0}^{E-1} (-1)^{\hat{c}_i} \cdot l_i \qquad \text{Equation 6}$$

In Equation 6, τ denotes a decision metric, E denotes a codeword length, $\hat{c}_i$ denotes an i-th bit of the estimated codeword bit sequence, and $l_i$ denotes an i-th bit of the LLR sequence $L=(l_0, l_1, \ldots, l_{E-1})$ given as an input of the decoder. As in Equation 6, even if the value calculated in Equation 5, i.e., the correlation metric τ, is linearly changed by using a predetermined value to perform addition, subtraction, multiplication, division, or the like thereon, there may be no change in the meaning of the value.

Although not shown in the drawing, in an embodiment of the disclosure, when calculating the correlation metric τ, the estimated codeword $\hat{x}=(\hat{x}_0, \hat{x}_1, \ldots, \hat{x}_{N-1})$ before rate-matching is performed and the LLR sequence $L'=(l_0, l_1, \ldots, l_{N-1})$ obtained by performing rate-dematching may be utilized. An index set of bits actually transmitted (i.e., not shortened or punctured) by the rate-matching in the bit sequence before the rate-matching is performed may be expressed by $\chi \subseteq \{0, 1, \ldots, N-1\}$. Specifically, a value calculated in Equation 5 may also be calculated in the same manner as in Equation 7 below.

$$\tau = \sum_{i \in \chi} (-1)^{\hat{x}_i} \cdot l'_i \qquad \text{Equation 7}$$

In Equation 7 above, τ denotes a decision metric, $\hat{x}_i$ denotes an i-th bit of the estimated codeword sequence before performing rate-matching, $l'_i$ denotes an i-th bit of the LLR sequence obtained by performing rate-dematching, and χ denotes an index set of bits actually transmitted using the rate-matching in the estimated codeword sequence before the rate-matching is performed.

It should be noted that the LLR value of the punctured and shortened bits is to be excluded when calculating the correlation metric in the same manner as in Equation 7 above. Since the LLR value of the punctured bit is initially 0, there is no need to be significantly careful. However, the LLR value of the shortened bit shall be excluded since it has any great positive value. The Equations 5 and 7 above have essentially the same value, and any method may be selected for implementation efficiency. In addition thereto, it should be noted that any method which takes an inner product and correlation of a re-encoded bit sequence and an LLR sequence may be used.

In the same manner, the correlation metric normalized by Equation 6 may be calculated as in Equation 8 below.

$$\tau = \frac{1}{E}\sum_{i \in \chi} (-1)^{\hat{x}_i} \cdot l'_i \qquad \text{Equation 8}$$

In Equation 8 above, τ denotes a decision metric, $\hat{x}_i$ denotes an i-th bit of the estimated codeword sequence before performing rate-matching, $l'_i$ denotes an i-th bit of the LLR sequence obtained by performing rate-dematching, and χ denotes an index set of bits actually transmitted using the rate-matching in the estimated codeword sequence before the rate-matching is performed.

Although the content of the disclosure is described hereinafter based on Equation 5, it should be noted that the content of the disclosure is not limited thereto.

It may be seen that the correlation metric τ calculated by the aforementioned Equations 5, 6, and 7 is developed to the following equation.

$$\tau = \sum_{i=0}^{E-1} (-1)^{\hat{c}_i} \cdot l_i = \sum_{i=0}^{E-1} \log \frac{p_{y_i|C_i}(y_i | C_i = \hat{c}_i)}{p_{y_i|C_i}(y_i | C_i = \sim\hat{c}_i)} \qquad \text{Equation 9}$$

In the equation above, $\sim\hat{c}_i$ denotes a value obtained by inverting a bit value $\hat{c}_i$. According to Equation 9, the correlation metric τ is a value representing a probability of how close a received signal is to a codeword generated based on a decoding result. Therefore, reliability of the decoding result is improved when this value is great, and is decreased when this value is small. Accordingly, in operation 614, the receiver may perform a validity check, based on the correlation metric. In this process, a path metric generated by a polar code decoder may be additionally utilized. In the disclosure, a correlation metric-based method added by the disclosure will be mainly introduced.

First, a predetermined threshold δ may be present for the validity check of the receiver. This value may be determined by a code length and dimension, a channel signal to noise ratio (SNR) measured in the receiver, a signal to noise and interference ratio (SINR), and a post-SNR, post-SINR, or the like further precisely calculated through channel estimation or the like. When the threshold δ is determined as such, this value may be compared with the correlation matric τ to check a decoding validity, and may provide a report thereof 606.

If the correlation metric τ calculated by using a method of Equations 5 and 6 is less than the threshold δ, the receiver may decide that the decoding result is not valid and may proceed a follow-up procedure dependent thereon. For example, even if an SCL decoder succeeds in a check based on outer coding, such as a CRC code, a PC code, or the like, the receiver may decide that the decoding result is not valid, discard the decoding result or perform it in a predetermined manner, and proceed a follow-up procedure dependent on the decoding failure.

On the other hand, if the correlation metric τ is greater than the threshold δ, the receiver may decide that the decoding result is valid, output an estimated encoding input bit sequence û and estimated codeword bit sequence ĉ obtained up to now, and report a decoding success, and then may proceed a follow-up procedure dependent thereon.

Although an operation in which the receiver performs a decoding validity check by utilizing only the correlation metric alone is introduced above, the receiver may additionally utilize the path metric generated by the decoder of the poler code, as described above. For example, in order for the receiver to decide a decoding success, a criterion may be used in which both a check based on the correlation metric and a check based on the path metric are satisfied. In addition, the receiver may selectively use one of two metric-based check methods, based on a code parameter, a channel environment, or the like, or may use both of the two methods.

Figure 7:
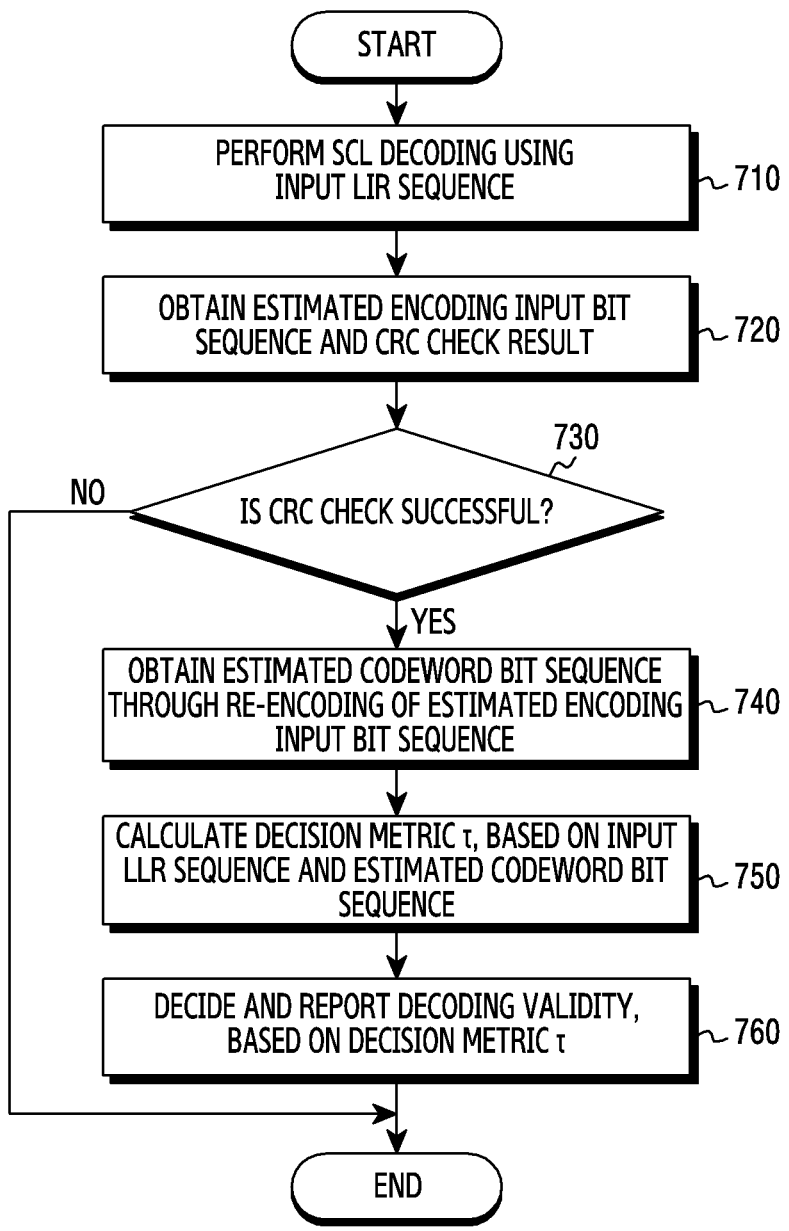
FIG. 7 is a flowchart illustrating a decoding validity check of a receiver according to an embodiment of the disclosure.

FIG. 7 is a flowchart illustrating a decoding validity check of a receiver according to an embodiment of the disclosure.

Referring to FIG. 7, the receiver according to the following description may be the receiving end 120 of FIG. 1 and the device of FIG. 2. The operation of the receiver of FIG. 7 may correspond to the operation of the receiver of FIG. 6.

In operation 710, the receiver may perform SCL decoding by using an input LLR sequence $L=(l_0, l_1, \ldots, l_{E-1})$.

In operation 720, the receiver may obtain an estimated encoding input bit sequence û and a CRC check result.

In operation 730, the receiver may decide whether the CRC check result is a success. If the receiver decides that the CRC check result is a failure in operation 730, the decoding process may end.

If the receiver decides that the CRC check result is the success in operation 730, a re-encoding process of the estimated encoding input bit sequence û may be performed in operation 740. The receiver may perform the re-encoding process of the estimated encoding input bit sequence û to obtain an estimated codeword bit sequence $\hat{c}=(c_0, c_1, \ldots, c_{E-1})$.

In operation 750, the receiver may calculate a decision metric τ, based on the input LLR sequence $L=(l_0, l_1, \ldots, l_{E-1})$ and the estimated codeword bit sequence $\hat{c}=(c_0, c_1, \ldots, c_{E-1})$.

In operation 760, the receiver may check a decoding validity, based on the decision metric τ, and may provide a report thereof.

Figure 8:
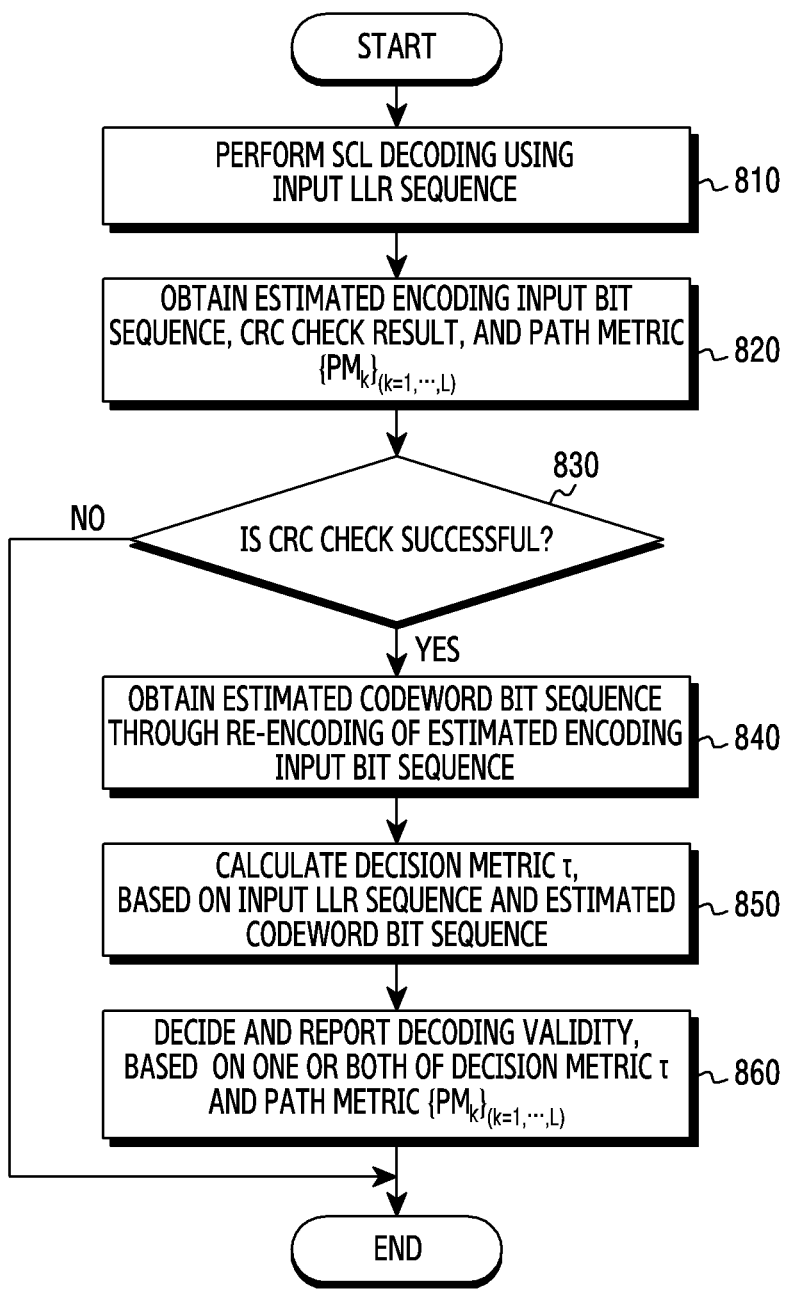
FIG. 8 is a flowchart illustrating a decoding validity check of a receiver according to an embodiment of the disclosure.

FIG. 8 is a flowchart illustrating a decoding validity check of a receiver according to an embodiment of the disclosure. The receiver according to the following description may be the receiving end 120 of FIG. 1 and the device of FIG. 2. The operation of the receiver of FIG. 8 may correspond to the operation of the receiver of FIG. 6.

Referring to FIG. 8, in operation 810, the receiver may perform SCL decoding by using an input LLR sequence $L=(l_0, l_1, \ldots, l_{E-1})$.

In operation 820, the receiver may obtain an estimated encoding input bit sequence û, a CRC check result, and a path metric $\{PM_k\}_{k=1,\ldots,L}$.

In operation 830, the receiver may decide whether the CRC check result is a success. If the receiver decides that the CRC check result is a failure in operation 830, the decoding process may end.

If the receiver decides that the CRC check result is the success in operation 830, a re-encoding process of the estimated encoding input bit sequence û may be performed in operation 840. The receiver may perform the re-encoding process of the estimated encoding input bit sequence û to obtain an estimated codeword bit sequence $\hat{c}=(c_0, c_1, \ldots, c_{E-1})$.

In operation 850, the receiver may calculate a decision metric τ, based on the input LLR sequence $L=(l_0, l_1, \ldots, l_{E-1})$ and the estimated codeword bit sequence $\hat{c}=(c_0, c_1, \ldots, c_{E-1})$.

In operation 860, the receiver may check a decoding validity, based on the decision metric τ and a path metric $\{PM_k\}_{k=1,\ldots,L}$, and may provide a report thereof The receiver may check the decoding validity, based on the decision metric τ, or may check the decoding validity, based on the path metric $\{PM_k\}_{k=1,\ldots,L}$. Alternatively, the receiver may check the decoding validity, based on both the decision metric τ and the path metric $\{PM_k\}_{k=1,\ldots,L}$.

Figure 9:
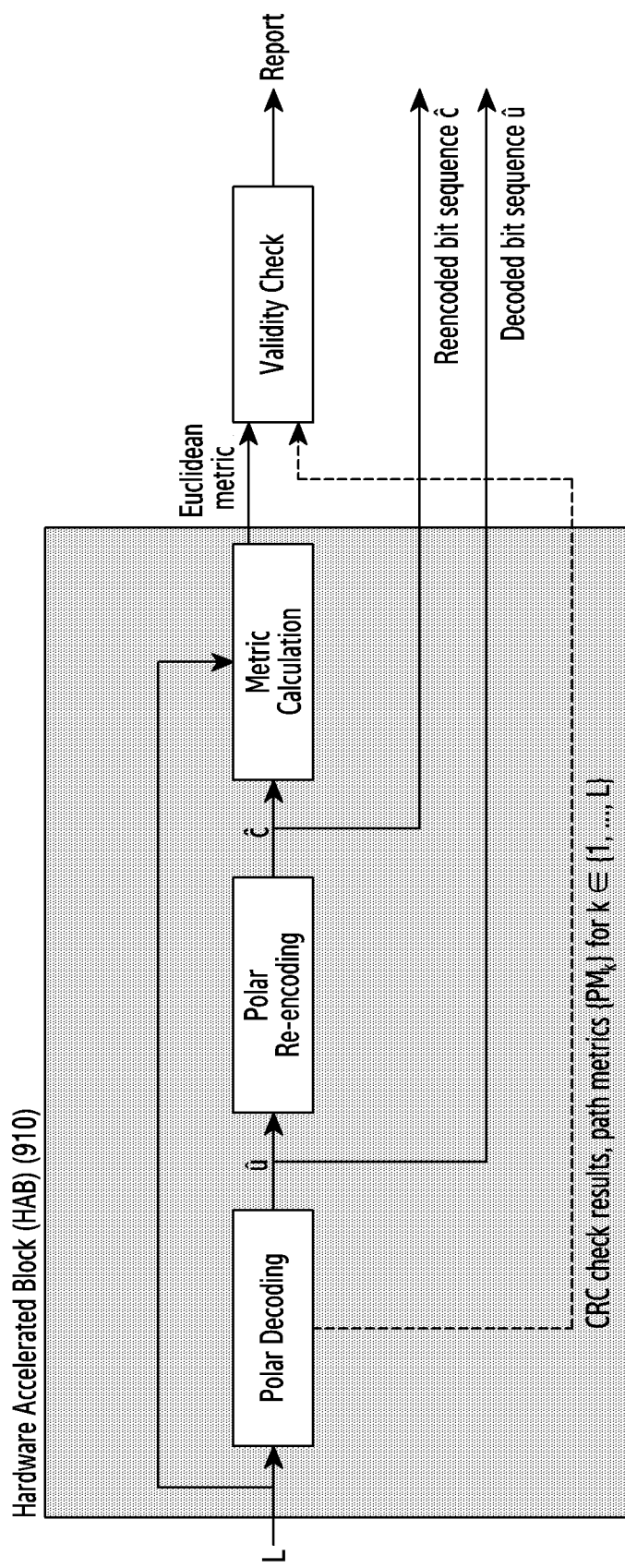
FIG. 9 illustrates a decoder of a receiver according to an embodiment of the disclosure.

FIG. 9 illustrates a decoder of a receiver according to an embodiment of the disclosure.

Referring to FIG. 9, it is illustrated that embodiments of the disclosure may be implemented such that some operations are operable quickly by means of a hardware accelerated block (HAB) 910. A device of FIG. 9 may imply a device of the receiver of FIG. 6.

Referring to FIG. 9, a decoder in the receiver may include a polar decoding unit, a polar re-encoding unit, a metric calculation unit, and a validity check unit.

The polar decoding unit may perform decoding of a polar code, based on the given LLR sequence $L=(l_0, l_1, \ldots, l_{E-1})$ 601. Accordingly, as a result of the decoding, the receiver may obtain an estimated encoding input bit sequence $\hat{u}$, a CRC check result, all or at least some (maximum, minimum, etc.) of values of a set of PMs in a list, i.e., $\{PM_k\}_{k=1, \ldots, L}$.

The validity check unit may decide a decoding success. When it is decided that the decoding fails through a check based on outer coding, such as a CRC code, a PC code, or the like, the validity check unit may end a follow-up procedure and report a decoding failure. The estimated encoding input bit sequence $\hat{u}$ to be output when the receiver fails in decoding may be determined according to a configuration of the decoder in the receiver. The estimated encoding input bit sequence $\hat{u}$ may be at least one of a random sequence, a predetermined sequence, and a list having a highest probability among lists even if a check based on a CRC code fails.

When the validity check unit decides that the CRC check result is a success, the polar re-encoding unit may re-encode the estimated input bit sequence $\hat{u}$ which is a decoding result. As a result of the re-encoding, the estimated codeword bit sequence $\hat{c}=(c_0, c_1, \ldots, c_{E-1})$ may be obtained. The re-encoding process may include all operations performed by the decoder of the transmitter, for example, multiplication with the generator matrix G, rate-matching, channel interleaving, or the like. The re-encoding may be initially performed for successive interference cancellation (SIC) in a multiple input multiple output (MIMO) system regardless of the purpose of the disclosure, and may be an operation performed by default in various communication and broadcasting systems. For example, embodiments according to the disclosure may be effectively implemented in a system in which the re-encoding is performed.

The metric calculation unit may calculate the correlation metric value $\tau$ by using the estimated codeword bit sequence $\hat{c}=(c_0, c_1, \ldots, c_{E-1})$ obtained through the re-encoding and the LLR sequence $L=(l_0, l_1, \ldots, l_{E-1})$ given as an input of the decoder. This value may be calculated based on the following equation.

$$\tau = \sum_{i=0}^{E-1} (-1)^{\hat{c}_i} \cdot l_i \qquad \text{Equation 5}$$

For convenience, the correlation metric may be normalized to a codeword length as shown in the following equation.

$$\tau = \frac{1}{E} \sum_{i=0}^{E-1} (-1)^{\hat{c}_i} \cdot l_i \qquad \text{Equation 6}$$

As in Equation 6, even if the value calculated in Equation 5, i.e., the correlation metric $\tau$, is linearly changed by using a predetermined value to perform addition, subtraction, multiplication, division, or the like thereon, there may be no change in the meaning of the value.

Alternatively, when calculating the correlation metric $\tau$, the estimated codeword $\hat{x}=(\hat{x}_0, \hat{x}_1, \ldots, \hat{x}_{N-1})$ before rate-matching is performed and the LLR sequence $L'=(l'_0, l'_1, \ldots, l'_{N-1})$ obtained by performing rate-dematching may be utilized. An index set of bits actually transmitted (i.e., not shortened or punctured) by the rate-matching in the bit sequence before the rate-matching is performed may be expressed by $\chi \subseteq \{0, 1, \ldots, N-1\}$. Specifically, a value calculated in Equation 5 may also be calculated in the same manner as in Equation 7 below.

$$\tau = \sum_{i \in \chi} (-1)^{\hat{x}_i} \cdot l'_i \qquad \text{Equation 7}$$

It should be noted that the LLR value of the punctured and shortened bits is to be excluded when calculating the correlation metric in the same manner as in Equation 7 above. Since the LLR value of the punctured bit is initially 0, there is no need to be significantly careful. However, the LLR value of the shortened bit shall be excluded since it has any great positive value. The Equations 5 and 7 above have essentially the same value, and any method may be selected for implementation efficiency. In addition thereto, it should be noted that any method which takes an inner product and correlation of a re-encoded bit sequence and an LLR sequence may be used.

In the same manner, the correlation metric normalized by Equation 6 may be calculated as in Equation 8 below.

$$\tau = \frac{1}{E} \sum_{i \in \chi} (-1)^{\hat{x}_i} \cdot l'_i \qquad \text{Equation 8}$$

Although the content of the disclosure is described hereinafter based on Equation 5, it should be noted that the content of the disclosure is not limited thereto.

It may be seen that the calculated correlation metric $\tau$ is developed to the following equation.

$$\tau = \sum_{i=0}^{E-1} (-1)^{\hat{c}_i} \cdot l_i = \sum_{i=0}^{E-1} \log \frac{p_{y_i|C_i}(y_i | C_i = \hat{c}_i)}{p_{y_i|C_i}(y_i | C_i = \sim\hat{c}_i)} \qquad \text{Equation 9}$$

In the equation above, $\sim\hat{c}_i$ denotes a value obtained by inverting a bit value $\hat{c}_i$. According to Equation 9, the correlation metric $\tau$ is a value representing a probability of how close a received signal is to a codeword generated based on a decoding result. Therefore, reliability of the decoding result is improved when this value is great, and is decreased when this value is small. Accordingly, a validity check unit may perform a validity check, based on the correlation metric. In this process, a path metric generated by a polar code decoder may be additionally utilized. For example, a predetermined threshold $\delta$ may be present for the validity check of the receiver. This value may be determined by a code length and dimension, a channel SNR measured in the receiver, a SINR, and a post-SNR, post-SINR, or the like further precisely calculated through channel estimation or the like. When the threshold $\delta$ is determined as such, this value may be compared with the correlation matric $\tau$ to check a decoding validity, and may provide a report thereof.

If the correlation metric $\tau$ calculated by using a method of Equations 5 and 6 is less than the threshold $\delta$, the receiver may decide that the decoding result is not valid and may proceed a follow-up procedure dependent thereon. For example, even if an SCL decoder succeeds in a check based on outer coding, such as a CRC code, a PC code, or the like, the receiver may decide that the decoding result is not valid, discard the decoding result or perform it in a predetermined manner, and proceed a follow-up procedure dependent on the decoding failure.

On the other hand, if the correlation metric τ is greater than the threshold δ, the receiver may decide that the decoding result is valid, output an estimated encoding input bit sequence û and estimated codeword bit sequence e obtained up to now, and report a decoding success, and then may proceed a follow-up procedure dependent thereon.

Figure 10:
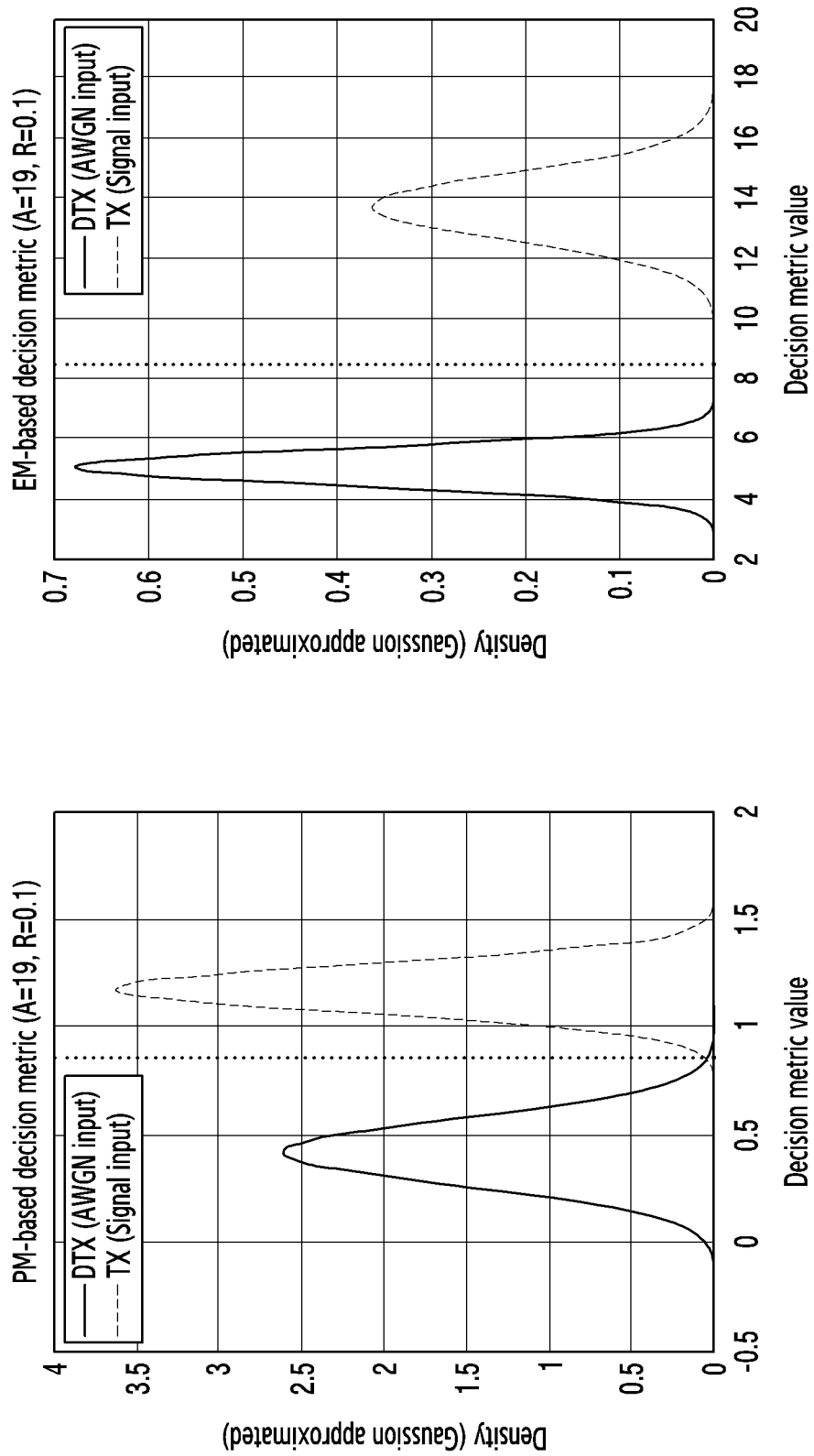
FIG. 10 illustrates an experiment for a case of determining that there is no error by a cyclic redundancy check (CRC) code and a parity check (PC) code after successive cancellation list (SCL) decoding in a discontinuous transmission (DTX) environment in which noise is input without a signal and a TX environment in which a scheduled signal is received according to an embodiment of the disclosure.
Figure 11:
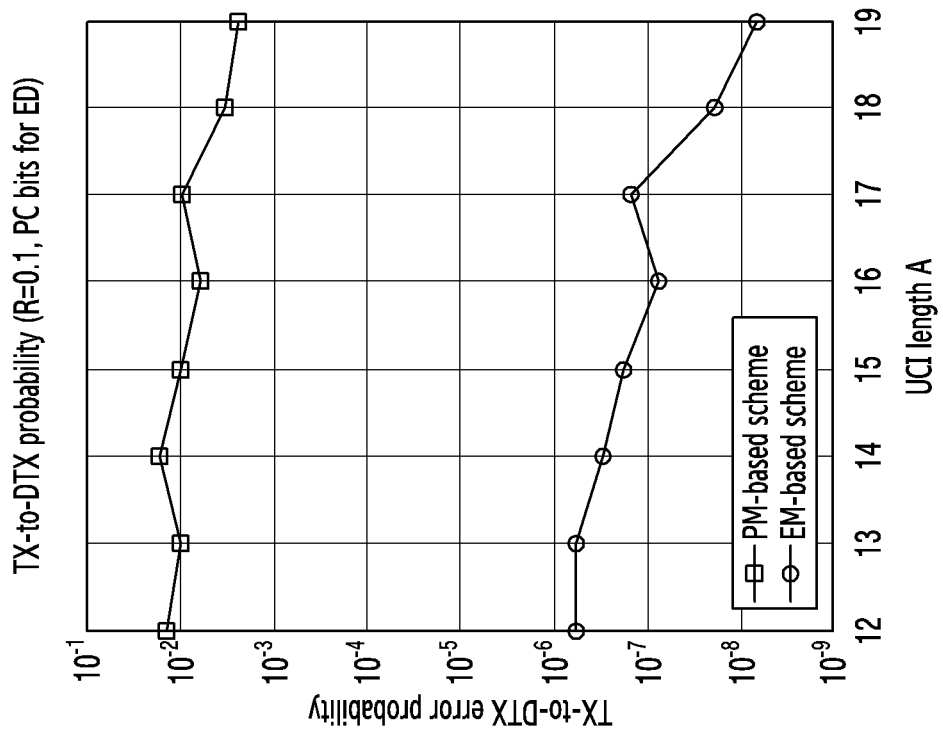
FIG. 11 illustrates a probability that DTX is incorrectly determined as TX and a probability that TX is incorrectly determined as DTX, when an optimal threshold is set based on an observed matric distribution according to an embodiment of the disclosure.
Figure 11:
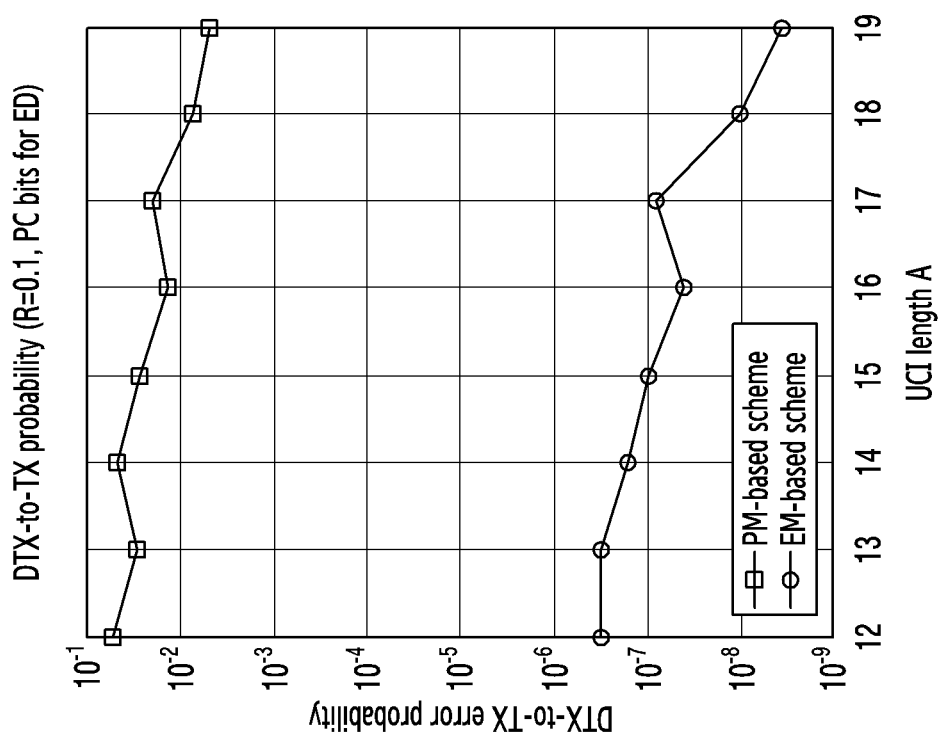

FIGS. 10 and 11 illustrate a result of an experiment for identifying an effect according to various embodiments of the disclosure. In this experiment, a polar code method used in 3 GPP NR uplink is considered. It is considered that an input length A of the polar code is 19 bits, and a length E of a final codeword is 190 bits. In this case, a length-6 CRC code and a length-3 PC code are used.

Referring to FIG. 10, it illustrates an experiment for a case of determining that there is no error by using a CRC code and a PC code after SCL decoding in a DTX environment in which noise is input without a signal and a TX environment in which a scheduled signal is received. In the above case, a case of the related art is illustrated in which an average and variance of a decision metric based on a path matric calculated as in Equation 4 and correlation matric calculated as in Equation 5 are obtained and then are subjected to Gaussian approximation.

FIG. 11 illustrates a probability that DTX is incorrectly determined as TX and a probability that TX is incorrectly determined as DTX, when an optimal threshold is set based on a matric distribution observed as shown in FIG. 10.

Referring to FIG. 11, as can be seen through FIGS. 10 and 11, if an appropriate threshold value is set, the decoding validity check method according to an embodiment of the disclosure shows better performance than the method of the related art.

An operating method of a receiving end according to an embodiment of the disclosure described above may include receiving a signal from a transmitting end, performing successive cancellation (SC) decoding, based on a log-likelihood ratio (LLR) sequence obtained from the received signal, obtaining an estimated codeword bit sequence by re-encoding an encoding input bit sequence obtained through the decoding, obtaining a decision metric, based on the estimated codeword bit sequence and the LLR sequence, and deciding whether the decoding is successful, based on the obtained decision metric.

In an embodiment of the disclosure, the obtaining of the estimated codeword bit sequence by re-encoding the estimated encoding input bit sequence through the decoding may include obtaining a code parameter and a code configuration, and obtaining the estimated encoding input bit sequence, based on the obtained code parameter and code configuration.

In an embodiment of the disclosure, the operating method of the receiving end may further include performing the SC decoding based on the LLR sequence to obtain a cyclic redundancy check (CRC) result and a path metric.

In an embodiment of the disclosure, the operating method of the receiving end may further include deciding whether the CRC result is a success, and determining that the decoding fails if the CRC result is a failure.

In an embodiment of the disclosure, the decision metric may be obtained based on the equation of:

$$\tau = \sum_{i=0}^{E-1} (-1)^{\hat{c}_i} l_i$$

where τ denotes a decision metric, E denotes a codeword length, $\hat{c}_i$ denotes an i-th bit of the estimated codeword bit sequence, and $l_i$ denotes an i-th bit of the LLR sequence.

In an embodiment of the disclosure, the decision metric may be obtained based on the equation of:

$$\tau = \sum_{i \in \chi} (-1)^{\hat{x}_i} \cdot l'_i$$

wherein τ denotes a decision metric, $\hat{x}_i$ denotes an i-th bit of the estimated codeword sequence before performing rate-matching, $l'_i$ denotes an i-th bit of the LLR sequence obtained by performing rate-dematching, and χ denotes an index set of bits actually transmitted using the rate-matching in the estimated codeword sequence before the rate-matching is performed.

In an embodiment of the disclosure, the deciding of whether the decoding is successful, based on the decision metric, may include determining that the decoding is successful if the decision metric is greater than a predetermined value.

An apparatus of a receiving end according to an embodiment of the disclosure described above may include a control unit, a memory, and a transceiver including a decoding unit. The transceiver may be configured to receive a signal from a transmitting end, perform SC decoding, based on a LLR sequence obtained from the received signal, obtain an estimated codeword bit sequence by re-encoding an encoding input bit sequence obtained through the decoding, obtain a decision metric, based on the estimated codeword bit sequence and the LLR sequence, and decide whether the decoding is successful, based on the obtained decision metric.

In an embodiment of the disclosure, in order to obtain the estimated codeword bit sequence by re-encoding the estimated encoding input bit sequence through the decoding, the transceiver may be configured to obtain a code parameter and a code configuration, and obtain the estimated encoding input bit sequence, based on the obtained code parameter and code configuration.

In an embodiment of the disclosure, the transceiver may be further configured to perform the SC decoding based on the LLR sequence to obtain a CRC result and a path metric.

In an embodiment of the disclosure, the transceiver may be further configured to decide whether the CRC result is a success, and determine that the decoding fails if the CRC result is a failure.

In an embodiment of the disclosure, the decision metric may be obtained based on the equation of:

$$\tau = \sum_{i=0}^{E-1} (-1)^{\hat{c}_i} l_i$$

where τ denotes a decision metric, E denotes a codeword length, $\hat{c}_i$ denotes an i-th bit of the estimated codeword bit sequence, and $l_i$ denotes an i-th bit of the LLR sequence.

In an embodiment of the disclosure, the decision metric may be obtained based on the equation of:

$$\tau = \sum_{i \in \chi} (-1)^{\hat{x}_i} \cdot l'_i$$

wherein τ denotes a decision metric, $\hat{x}_i$ denotes an i-th bit of the estimated codeword sequence before performing rate-matching, $l'_i$ denotes an i-th bit of the LLR sequence obtained by performing rate-dematching, and χ denotes an index set of bits actually transmitted using the rate-matching in the estimated codeword sequence before the rate-matching is performed.

In an embodiment of the disclosure, the transceiver may be further configured to determine that the decoding is successful if the decision metric is greater than a predetermined value.

Methods based on the embodiments disclosed in the claims and/or specification of the disclosure may be implemented in hardware, software, or a combination of both.

When implemented in software, computer readable recording medium for storing one or more programs (i.e., software modules) may be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the disclosure.

The program (i.e., the software module or software) may be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network, such as the Internet, an Intranet, a local area network (LAN), a wide LAN (WLAN), or a storage area network (SAN) or a communication network configured by combining the networks. The storage device may have access to a device for performing an embodiment of the disclosure via an external port. In addition, an additional storage device on a communication network may have access to the device for performing the embodiment of the disclosure.

In the aforementioned specific embodiments of the disclosure, a component included in the disclosure is expressed in a singular or plural form according to the specific embodiment proposed herein. However, the singular or plural expression is selected properly for a situation proposed for the convenience of explanation, and thus the various embodiments of the disclosure are not limited to a single or a plurality of components. Therefore, a component expressed in a plural form may also be expressed in a singular form, or vice versa.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a receiving end in a wireless communication system, the method comprising:
   receiving a signal from a transmitting end;
   performing successive cancellation (SC) decoding, based on a log-likelihood ratio (LLR) sequence based on the received signal, to obtain an encoding input bit sequence;
   obtaining an estimated codeword bit sequence by re-encoding the encoding input bit sequence obtained through the SC decoding;
   obtaining a decision metric, based on the estimated codeword bit sequence and the LLR sequence; and
   deciding whether the SC decoding is successful, based on the obtained decision metric,
   wherein the SC decoding is determined to be successful when the obtained decision metric is greater than or equal to a threshold δ.

2. The method of claim 1, further comprising:
   performing the SC decoding based on the LLR sequence to obtain a cyclic redundancy check (CRC) result and a path metric.

3. The method of claim 2, further comprising:
   deciding whether the CRC result is a success; and
   determining that the SC decoding fails if the CRC result is a failure.

4. The method of claim 1, wherein the decision metric is obtained based on the following equation:

$$\tau = \sum_{i=0}^{E-1} (-1)^{\hat{c}_i} l_i,$$

where τ denotes a decision metric, E denotes a codeword length of the estimated codeword bit sequence, $\hat{c}_i$ denotes an i-th bit of the estimated codeword bit sequence, and $l_i$ denotes an i-th bit of the LLR sequence.

5. The method of claim 1, further comprising:
   performing a rate-dematching process on the signal to obtain the LLR sequence,
   wherein the decision metric is obtained based on the following equation:

$$\tau = \sum_{i \in \chi} (-1)^{\hat{x}_i} l'_i$$

where τ denotes a decision metric, $\hat{x}_i$ denotes an i-th bit of the estimated codeword bit sequence, $l'_i$ denotes an i-th bit of the LLR sequence obtained by performing the rate-dematching, and χ denotes an index set of bits actually transmitted in the estimated codeword sequence is performed.

6. The method of claim 1, wherein the deciding of whether the SC decoding is successful, based on the decision metric, comprises determining that the decoding is successful if the decision metric is greater than a predetermined value.

7. A receiving end in a wireless communication system, the receiving end comprising:
   a transceiver including a decoding unit;
   a memory; and
   at least one processor coupled with the transceiver and memory, wherein the at least one processor is configured to:
   receive a signal from a transmitting end,
   perform successive cancellation (SC) decoding, based on a log-likelihood ratio (LLR) sequence based on the received signal, to obtain an encoding input bit sequence,
   obtain an estimated codeword bit sequence by re-encoding the encoding input bit sequence obtained through the SC decoding,
   obtain a decision metric, based on the estimated codeword bit sequence and the LLR sequence; and
   decide whether the decoding is successful, based on the obtained decision metric,
   wherein the SC decoding is determined to be successful when the obtained decision metric is greater than or equal to a threshold δ.

8. The receiving end of claim 7, wherein the at least one processor is further configured to perform the SC decoding based on the LLR sequence to obtain a cyclic redundancy check (CRC) result and a path metric.

9. The receiving end of claim 8, wherein the at least one processor is further configured to:
decide whether the CRC result is a success, and
determine that the decoding fails if the CRC result is a failure.

10. The receiving end of claim 7, wherein the decision metric is obtained based on the following equation:

$$\tau = \sum_{i=0}^{E-1} (-1)^{\hat{c}_i} l_i$$

where $\tau$ denotes a decision metric, E denotes a codeword length of the estimated codeword bit sequence, $\hat{c}_i$ denotes an i-th bit of the estimated codeword bit sequence, and $l_i$ denotes an i-th bit of the LLR sequence.

11. The receiving end of claim 7,
wherein the at least one processor is further configured to obtain the LLR sequence by performing a rate-dematching process on the received signal, and
wherein the decision metric is obtained based on the following equation:

$$\tau = \Sigma_{i \in \chi} (-1)^{\hat{x}_i} \cdot l'_i$$

where $\tau$ denotes a decision metric, $\hat{x}_i$ denotes an i-th bit of the estimated codeword bit sequence, $l'_i$ denotes an i-th bit of the LLR sequence obtained by performing rate-dematching, and $\chi$ denotes an index set of bits actually transmitted in the estimated codeword sequence.

12. The receiving end of claim 7, wherein the at least one processor is further configured to determine that the decoding is successful if the decision metric is greater than a predetermined value.

13. The receiving end of claim 12, wherein, if it is determined that the decoding is successful, the at least one processor is further configured to:
output an estimated encoding input bit sequence and the estimated codeword bit sequence, and
report the decoding success.

14. At least one non-transitory computer readable storage medium configured to store one or more computer programs including instructions that, when executed by at least one processor, cause the at least one processor to control to:
receive a signal from a transmitting end,
perform successive cancellation (SC) decoding, based on a log-likelihood ratio (LLR) sequence based on the received signal, to obtain an encoding input bit sequence,
obtain an estimated codeword bit sequence by re-encoding the encoding input bit sequence obtained through the SC decoding,
obtain a decision metric, based on the estimated codeword bit sequence and the LLR sequence; and
decide whether the SC decoding is successful, based on the obtained decision metric,
wherein the SC decoding is determined to be successful when the obtained decision metric is greater than or equal to a threshold $\delta$.

* * * * *